(12) United States Patent
Xu et al.

(10) Patent No.: US 11,641,207 B2
(45) Date of Patent: May 2, 2023

(54) FAST LOCK PHASE-LOCKED LOOP CIRCUIT FOR AVOIDING CYCLE SLIP

(71) Applicant: ZHEJIANG UNIVERSITY, Zhejiang (CN)

(72) Inventors: Zhiwei Xu, Hangzhou (CN); Jiangbo Chen, Hangzhou (CN); Jiabing Liu, Hangzhou (CN); Hui Nie, Hangzhou (CN); Zhihao Lv, Hangzhou (CN); Chunyi Song, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/668,394

(22) Filed: Feb. 10, 2022

(65) Prior Publication Data

US 2022/0311444 A1 Sep. 29, 2022

Related U.S. Application Data

(63) Continuation of application No. PCT/CN2020/100641, filed on Jul. 7, 2020.

(30) Foreign Application Priority Data

Aug. 30, 2019 (CN) .......................... 201910811308.X

(51) Int. Cl.
*H03L 7/089* (2006.01)
*H03L 7/093* (2006.01)
(Continued)

(52) U.S. Cl.
CPC ............ *H03L 7/0891* (2013.01); *H03L 7/093* (2013.01); *H03L 7/099* (2013.01); *H03L 7/101* (2013.01)

(58) Field of Classification Search
CPC . H03L 7/089; H03L 7/01; H03L 7/093; H03L 7/099; H03L 7/101
See application file for complete search history.

(56) References Cited

U.S. PATENT DOCUMENTS 7,005,928 B2 * 2/2006 Albasini ............... H03L 7/0891
327/148
8,854,095 B2 * 10/2014 Katyal .................... H03L 7/101
327/156

(Continued)

FOREIGN PATENT DOCUMENTS

CN 1901376 A 1/2007
CN 107820681 A * 3/2018 ............... H03K 5/19

(Continued)

OTHER PUBLICATIONS

International Search Report (PCT/CN2020/100641); dated Oct. 14, 2020.

(Continued)

*Primary Examiner* — Adam D Houston
(74) *Attorney, Agent, or Firm* — W&G Law Group

(57) ABSTRACT

Disclosed is a fast lock phase-locked loop circuit for avoiding cycle slip, which belongs to the technical field of integrated circuits. The fast lock phase-locked loop circuit includes a phase frequency detector, a charge pump, an intermediate stage circuit, a loop filter, a voltage-controlled oscillator and a frequency divider. The phase frequency detector, the charge pump, the intermediate stage circuit, the loop filter and the voltage-controlled oscillator are connected in sequence; an output OUT end of the voltage-controlled oscillator is connected with an input IN end of frequency divider, and an output OUT end of the frequency divider is connected with an input IN end of the phase frequency detector to form a feedback path. The output clock frequency of the VCO and the expected frequency, i.e., (Continued)

the reference clock frequency and the feedback clock frequency, are prevented from being too close when the loop is started.

2 Claims, 5 Drawing Sheets

(51) Int. Cl.
*H03L 7/099* (2006.01)
*H03L 7/10* (2006.01)

(56) References Cited

U.S. PATENT DOCUMENTS

| | | | | |
|---|---|---|---|---|
| 9,515,669 | B2* | 12/2016 | Reddy | H03L 7/00 |
| 9,520,888 | B1* | 12/2016 | Chettuvetty | H03L 7/093 |
| 9,935,640 | B1* | 4/2018 | Chan | H03C 3/0991 |
| 9,954,543 | B1* | 4/2018 | Chan | H03L 7/099 |
| 10,862,427 | B1* | 12/2020 | Chan | H03C 3/0966 |
| 2003/0042985 | A1* | 3/2003 | Shibahara | H03L 7/113 331/17 |
| 2003/0071689 | A1* | 4/2003 | Magazzu | H03K 17/162 331/16 |
| 2004/0061536 | A1* | 4/2004 | Katoh | H03L 7/099 327/156 |
| 2006/0056491 | A1* | 3/2006 | Lim | H03L 7/0805 375/376 |
| 2006/0139105 | A1* | 6/2006 | Maxim | H03L 7/0898 331/16 |
| 2007/0018733 | A1* | 1/2007 | Wang | H03L 7/101 331/16 |
| 2007/0120612 | A1* | 5/2007 | Fu | H03L 7/095 331/34 |
| 2008/0007311 | A1* | 1/2008 | Choi | H03L 7/087 327/156 |
| 2008/0036543 | A1 | 2/2008 | Bazes | |
| 2008/0036544 | A1* | 2/2008 | Wang | H03L 7/095 331/16 |
| 2009/0243736 | A1* | 10/2009 | Miura | H03L 7/113 331/1 R |
| 2009/0245450 | A1* | 10/2009 | Miura | H03L 7/0896 375/376 |
| 2010/0141347 | A1* | 6/2010 | Hsiao | H03L 7/113 331/17 |
| 2011/0032011 | A1* | 2/2011 | Kim | H03L 7/1976 331/10 |
| 2011/0260763 | A1* | 10/2011 | Wang | H03L 7/099 327/157 |
| 2011/0267146 | A1* | 11/2011 | Finocchiaro | H03L 7/103 331/2 |
| 2015/0061737 | A1* | 3/2015 | Abbasi | H03L 7/1075 327/156 |
| 2017/0324418 | A1* | 11/2017 | Kao | H03L 7/113 |
| 2019/0273501 | A1* | 9/2019 | Kubo | H04L 7/033 |

FOREIGN PATENT DOCUMENTS

| | | | |
|---|---|---|---|
| CN | 207884600 U | | 9/2018 |
| CN | 108718195 A | | 10/2018 |
| CN | 110474634 A | | 11/2019 |
| CN | 112290936 A | * 1/2021 | H03L 7/087 |
| JP | H0613898 A | * 1/1994 | |
| JP | 2003318732 A | 11/2003 | |
| JP | 2007288647 A | 11/2007 | |
| JP | 2010130412 A | 6/2010 | |
| KR | 20100031892 A | * 3/2010 | |
| WO | WO-2018187335 A1 | * 10/2018 | H03K 21/023 |

OTHER PUBLICATIONS

CN First Office Action(201910813081.X); dated May 27, 2020.
JP First Office Action(JP2021-549569); dated Oct. 21, 2022.

* cited by examiner

FAST LOCK PHASE-LOCKED LOOP CIRCUIT FOR AVOIDING CYCLE SLIP

CROSS-REFERENCE TO RELATED APPLICATIONS

The present application is a continuation of International Application No. PCT/CN2020/100641, filed on Jul. 7, 2020, which claims priority to Chinese Application No. 201910813081.X, filed on Aug. 30, 2019, the contents of both of which are incorporated herein by reference in their entireties.

TECHNICAL FIELD

The present application belongs to the technical field of integrated circuits, and particularly relates to a fast lock phase-locked loop circuit for avoiding cycle slip.

BACKGROUND

A phase-locked loop (PLL) is a frequency control system, which is widely used in circuit design, including clock generation, clock recovery, jitter and noise reduction, frequency synthesis and so on. PLL operation is based on the phase difference in feedback between a reference clock signal and an output clock signal of a voltage-controlled oscillator (VCO). Cycle slip means that when the feedback clock frequency is less than the reference clock frequency, charging should be performed at this time, but because the phase of the reference clock lags behind the feedback clock, the charge pump discharges the loop filter instead. Or conversely, when the feedback clock frequency is greater than the reference clock frequency, the power should be discharged at this time, but because the phase of the reference clock is ahead of the feedback clock, the charge pump charges the loop filter instead. This phenomenon often occurs when the loop starts or when the frequency jumps.

On the other hand, if the reference clock frequency is very close to the feedback clock frequency, the average outflow or inflow current of the charge pump in each cycle is very small, and the change of the corresponding control voltage Vc of the VCO and the output frequency of the VCO is also very small. This leads to the slow phase change between the reference clock and the feedback clock, which greatly increases the locking time of the loop, especially in Kvco and systems with a small loop bandwidth.

However, in traditional designs, in order to speed up the loop locking and avoid greatly prolonging the loop locking time caused by cycle slip, extra current is added in the charge pump to increase the loop bandwidth and reduce the loop locking time, and then the extra charge pump is turned off after the loop locking. This not only reduces the loop bandwidth after loop locking, thus reducing the output noise of the system, but also accelerates the process of loop locking. But it also increases the power consumption of the system and the complexity of the circuit to a certain extent.

SUMMARY

The purpose of the present application is to provide a fast lock phase-locked loop circuit to avoid cycle slip without increasing circuit complexity and power consumption of the system.

The present application is different from the traditional phase-locked loop circuit for avoiding cycle slip in that no extra charge pump is added, but the initial output frequency of the VCO is changed by adjusting the initial control voltage of the VCO when the loop starts, so that the initial output frequency has a certain difference from the expected frequency; furthermore, a time of 10-20 reference clock cycles is given to make the phase of the reference clock really ahead of or lag behind the feedback clock, thereby avoiding the situation that the phase change between the reference clock frequency and the feedback clock frequency is too slow in the locking process and the locking time is greatly increased due to the fact that reference clock frequency and the feedback clock frequency are too close.

To achieve the above purpose, the present application is realized by the following technical scheme: a fast lock phase-locked loop circuit for avoiding cycle slip, comprising a phase frequency detector, a charge pump, an intermediate stage circuit, a loop filter, a voltage-controlled oscillator and a frequency divider, wherein an output OP end of the phase frequency detector is connected with an input IP end of the charge pump, and an output ON end of the phase frequency detector is connected with an input IN end of the charge pump; an output end of the charge pump is connected with an input IN end of the intermediate stage circuit, an output end of the intermediate stage circuit is connected with an input end of the loop filter, an output end of the loop filter is connected with an input end of the voltage-controlled oscillator, an output end of the voltage-controlled oscillator is connected with an input end of the frequency divider, an output end of the frequency divider is connected with an input IN end of the phase frequency detector to form a feedback path.

Furthermore, the intermediate stage circuit comprises a power supply, a first voltage dividing resistor R1, a second voltage dividing resistor R2, an inverter, a first transmission gate T1, a second transmission gate T2, a counter, and an NMOS switch M1; wherein an end of the second transmission gate T2 is connected with the output end of the charge pump; one port of the intermediate stage circuit is connected with the inverter, the inverter is connected with one input end of the counter, an output end of the counter is connected with a gate G end of the NMOS switch M1, and a source S end of the NMOS switch M1 is grounded; the other port of the intermediate stage circuit is connected with the other input end of the counter; the power supply is connected with the first voltage dividing resistor R1, the first voltage dividing resistor R1 is connected in series with the second voltage dividing resistor R2, and the second voltage dividing resistor R2 is grounded; output ends of the first voltage dividing resistor R1 and the second voltage dividing resistor R2 are connected to one end of the first transmission gate T1; the other end of the first transmission gate T1, a drain D end of the NMOS switch M1 and the other end of the second transmission gate T2 are connected to the input end of the loop filter.

Furthermore, an OPEN_LOOP control signal is input from one port of the intermediate stage circuit, and an OPEN_LOOP N signal is obtained after passing through the inverter; the OPEN_LOOP control signal and the OPEN_LOOP N signal jointly control switches of the first transmission gate T1 and the second transmission gate T2 and the counter; when the control signal OPEN_LOOP is at a high level, the first transmission gate T1 is closed and the second transmission gate T2 is opened, and the feedback path is in a normal locked state; the charge pump is directly connected with the loop filter through the second transmission gate T2, and the loop filter outputs a voltage signal Vc, which is a control voltage of the voltage-controlled oscillator; while when the control signal OPEN_LOOP is at a low level, the first transmission gate T1 is opened and the second transmission gate T2 is closed, in which case, the loop is in a state of automatic frequency calibration and cycle slip avoidance; the power supply transmits a voltage signal VDD to the first voltage dividing resistor R1 and the second voltage dividing resistor R2, the first voltage dividing resistor R1 and the second voltage dividing resistor R2 output a voltage signal of VDD/2, and meanwhile an output signal PLUSE of the counter is at a low level, that is, a gate G voltage of the NMOS switch M1 is at a low level and is in a turned-off state; the first voltage dividing resistor R1 and the second voltage dividing resistor R2 are connected to the loop filter through the first transmission gate T1, and the loop filter outputs a voltage signal Vc=VDD/2, which is the control voltage of the voltage-controlled oscillator; when the control signal OPEN_LOOP jumps from a low level to a high level, the counter starts to work, and at the same time, a reference clock signal CLK_REF is input to the counter as a clock signal thereof through the other port of the intermediate stage circuit, in which case, when the counter counts, an output signal PLUSE of the counter is at a high level, and the NMOS switch M1 is turned on, at which moment, the drain end D of the NMOS switch M1 is connected with the loop filter, and an input voltage signal LPF_IN of the loop filter is 0, that is, the control voltage VC of the voltage-controlled oscillator is 0; when the counter finishes counting, an output signal PLUSE thereof changes to a low level again, and the NMOS switch M1 is turned off, at which moment, the first transmission gate T1 is closed, and the second transmission gate T2 is opened; the charge pump is directly connected with the loop filter through the second transmission gate T2, and the loop filter outputs a voltage signal Vc, which is the control voltage of the voltage-controlled oscillator.

The present application has the following beneficial effects. The fast lock phase-locked loop circuit for avoiding cycle slip provided by the present application adds an intermediate circuit between the charge pump and the loop filter without increasing circuit complexity and power consumption of the system. The intermediate circuit plays two roles, i.e., one is to disconnect the VCO from the loop in the process of automatic frequency calibration, control Vc at VDD/2, and select the tuning curve of the VCO by an automatic frequency calibration module to make it closest to the desired frequency; the other one is to re-connect the loop and provide a low potential Vc of 10-20 reference clock cycles after the loop is pre-started so that the corresponding VCO output frequency will be less than the expected frequency. At the same time, since the reference clock frequency is greater than the feedback clock frequency, after several reference clock cycles, it is ensured that the phase of the reference clock will be ahead of the phase of the feedback clock. This ensures that when the intermediate circuit releases Vc and the loop really starts, the frequency of the feedback clock signal is smaller than that of the reference clock signal and its phase lags behind that of the reference clock. The charge pump charges the loop filter to increase the output frequency of the VCO. This avoids the cycle slip phenomenon when the circuit is started, and on this basis, the loop locking time is greatly increased due to the inconsistency but small difference between the reference clock frequency and the feedback clock frequency. By changing the initial frequency of the VCO when the loop is started, it is ensured that the phases of the feedback clock signal CLK_DIV and the reference clock signal CLK_REF are in the correct sequence, so as to actively avoid cycle slip. In addition, the situation that the loop falls into an abnormal locking state because the output clock frequency is too close to the expected clock frequency when the loop is started is avoided, and the fast locking of the phase-locked loop is realized.

DESCRIPTION OF EMBODIMENTS

The present application will be described in detail below with reference to the attached drawings, so that the objects and effects of the present application will become clearer. It should be appreciated that what is described here is only for explaining the present application, and is not intended to limit the present application.

Figure 1:
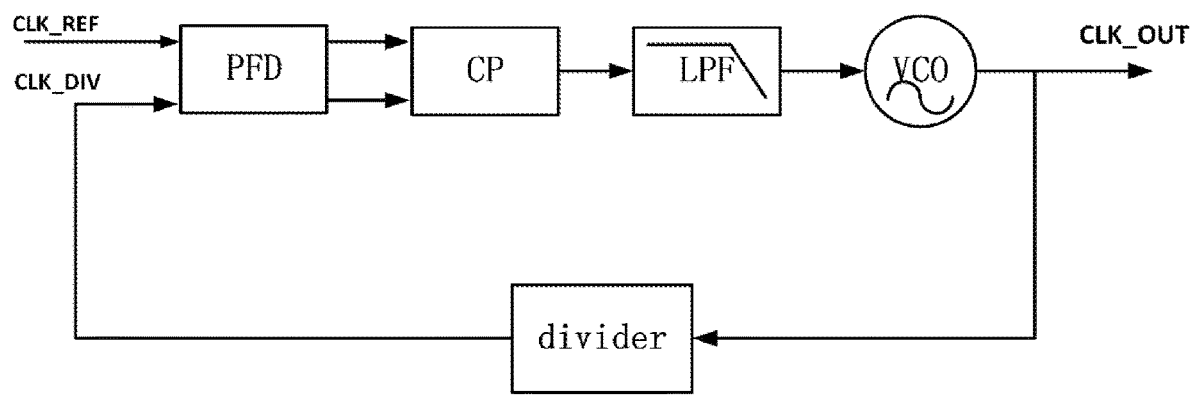
FIG. 1 is a schematic diagram of a conventional phase-locked loop circuit.
Figure 2:
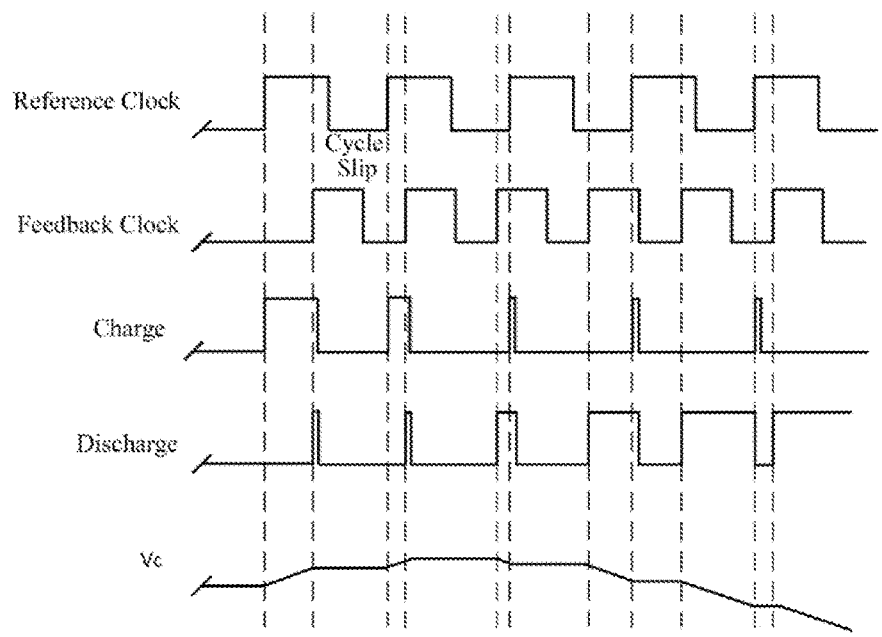
FIG. 2 is a schematic diagram of cycle slip phenomenon.
Figure 3:
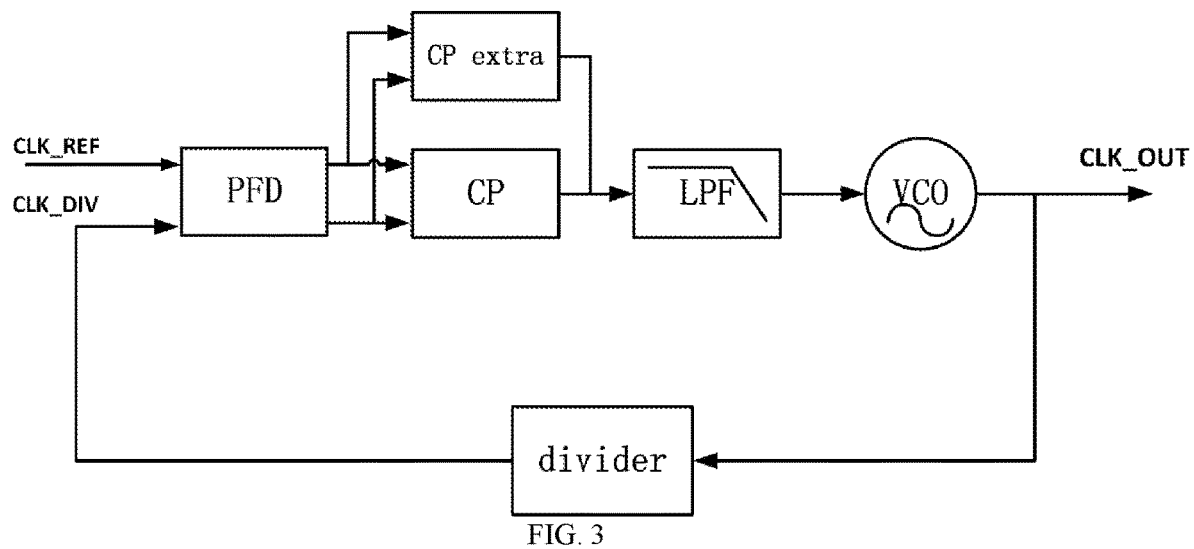
FIG. 3 is a schematic diagram of a conventional phase-locked loop circuit for avoiding cycle slip.

FIGS. 1-3 is a traditional PLL circuit for accelerating locking to avoid cycle slip, which increases the output current of the charge pump by adding extra charge pump units during locking, thereby increasing the loop bandwidth to achieve the purpose of accelerating locking. Although this approach can speed up the locking process to a certain extent, it does not solve the problem essentially, that is, the occurrence of cycle slip and the abnormal locking state caused by the initial output frequency being too close to the expected frequency. Moreover, the extra charge pump unit means larger current and larger current noise, thus reducing the phase noise of the system output signal.

Figure 4:
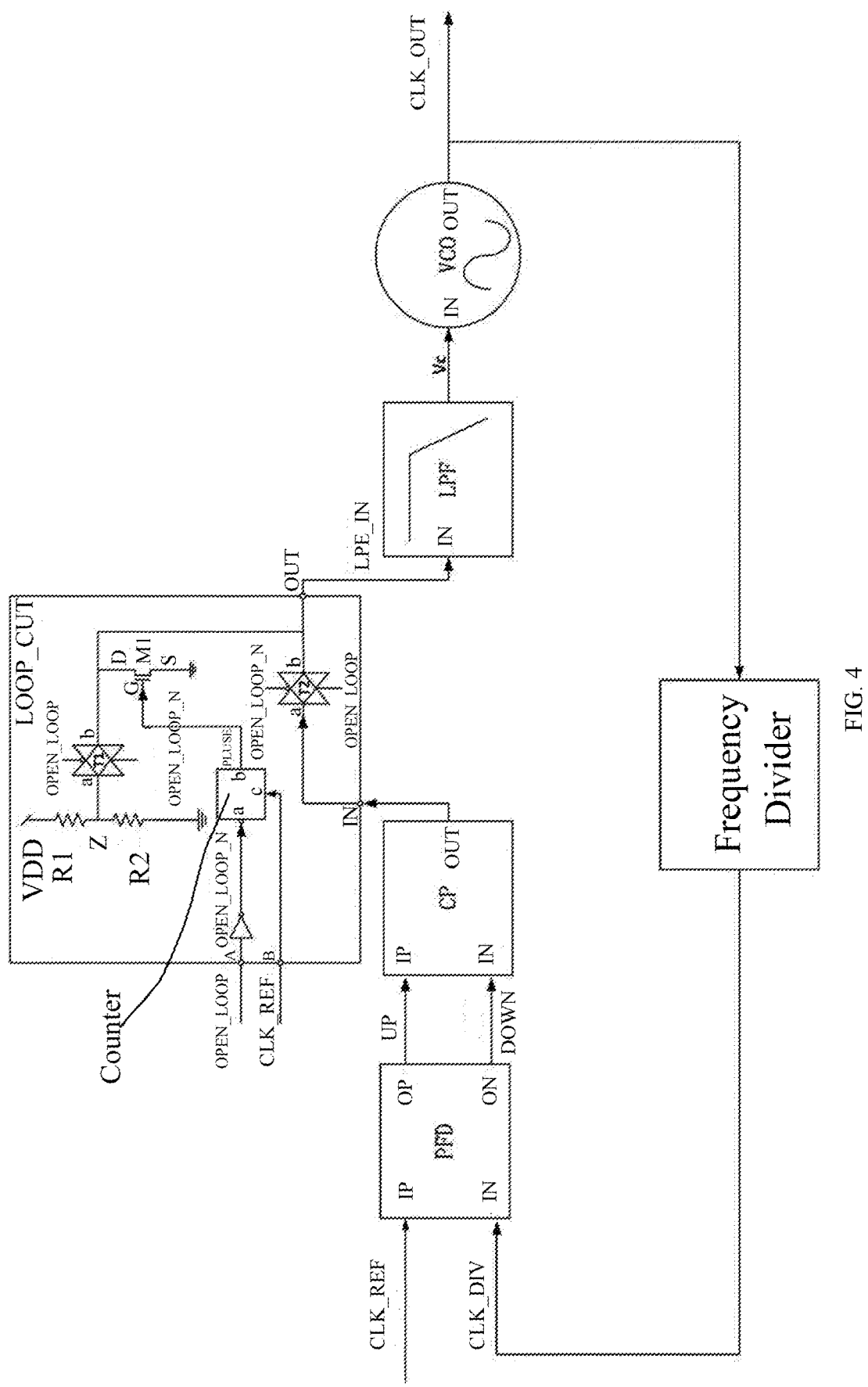
FIG. 4 is a tuning curve diagram of a VCO.

FIG. 4 is a schematic structural diagram of a fast lock phase-locked loop circuit for avoiding cycle slip according to the present application. In addition to a phase frequency detector (PFD), a charge pump (CP), a loop filter (LPF), a voltage-controlled oscillator (VCO) and a frequency divider (divider), the fast lock phase-locked loop circuit further includes an intermediate stage circuit (LOOP_CUT). The phase frequency detector, the charge pump, the intermediate stage circuit, the loop filter, the voltage-controlled oscillator and the frequency divider are connected in sequence; an output OP end of the phase frequency detector is connected with an input IP end of the charge pump, and an output ON end of the phase frequency detector is connected with an input IN end of the charge pump; an output end of the charge pump is connected with an input IN end of the intermediate stage circuit, an output end of the intermediate stage circuit is connected with an input end of the loop filter, an output end of the loop filter is connected with an input end of the voltage-controlled oscillator, an output end of the voltage-controlled oscillator is connected with an input end of the frequency divider, an output end of the frequency divider is connected with an input IN end of the phase frequency detector to form a feedback path.

The intermediate stage circuit comprises a power supply, a first voltage dividing resistor R1, a second voltage dividing resistor R2, an inverter, a first transmission gate T1, a second transmission gate T2, a counter, and an NMOS switch M1;

wherein an end of the second transmission gate T2 is connected with the output end of the charge pump; one port of the intermediate stage circuit is connected with the inverter, the inverter is connected with one input end of the counter, an output end of the counter is connected with a gate G end of the NMOS switch M1, and a source S end of the NMOS switch M1 is grounded; the other port of the intermediate stage circuit is connected with the other input end of the counter; the power supply is connected with the first voltage dividing resistor R1, the first voltage dividing resistor R1 is connected in series with the second voltage dividing resistor R2, and the second voltage dividing resistor R2 is grounded; output ends of the first voltage dividing resistor R1 and the second voltage dividing resistor R2 are connected to one end of the first transmission gate T1; the other end of the first transmission gate T1, a drain D end of the NMOS switch M1 and the other end of the second transmission gate T2 are connected to the input end of the loop filter.

An OPEN_LOOP control signal is input from one port of the intermediate stage circuit, and an OPEN_LOOP N signal is obtained after passing through the inverter; the OPEN_LOOP control signal and the OPEN_LOOP N signal jointly control switches of the first transmission gate T1 and the second transmission gate T2 and the counter; when the control signal OPEN_LOOP is at a high level, the first transmission gate T1 is closed and the second transmission gate T2 is opened, and the feedback path is in a normal locked state; the charge pump is directly connected with the loop filter through the second transmission gate T2, and the loop filter outputs a voltage signal Vc, which is a control voltage of the voltage-controlled oscillator.

When the control signal OPEN_LOOP is at a low level, the first transmission gate T1 is opened and the second transmission gate T2 is closed, in which case, the loop is in a state of automatic frequency calibration and cycle slip avoidance; the power supply transmits a voltage signal VDD to the first voltage dividing resistor R1 and the second voltage dividing resistor R2, the first voltage dividing resistor R1 and the second voltage dividing resistor R2 output a voltage signal of VDD/2, and meanwhile an output signal PLUSE of the counter is at a low level, that is, a gate G voltage of the NMOS switch M1 is at a low level and is in a turned-off state; the first voltage dividing resistor R1 and the second voltage dividing resistor R2 are connected to the loop filter through the first transmission gate T1, and the loop filter outputs a voltage signal Vc=VDD/2, which is the control voltage of the voltage-controlled oscillator.

When the control signal OPEN_LOOP jumps from a low level to a high level, the counter starts to work, and at the same time, a reference clock signal CLK_REF is input to the counter as a clock signal thereof through the other port of the intermediate stage circuit, in which case, when the counter counts, an output signal PLUSE of the counter is at a high level, and the NMOS switch M1 is turned on, at which moment, the drain end D of the NMOS switch M1 is connected with the loop filter, and an input voltage signal LPF_IN of the loop filter is 0, that is, the control voltage VC of the voltage-controlled oscillator is 0.

When the counter finishes counting, an output signal PLUSE thereof changes to a low level again, and the NMOS switch M1 is turned off, at which moment, the first transmission gate T1 is closed, and the second transmission gate T2 is opened; the charge pump is directly connected with the loop filter through the second transmission gate T2, and the loop filter outputs a voltage signal Vc, which is the control voltage of the voltage-controlled oscillator; at this time, the loop enters a normal locking state.

The work of the fast lock phase-locked loop circuit is as follows: when the locked phase-locked loop circuit is started, the control signal OPEN_LOOP starts at a low level, and the loop is in an automatic frequency calibration state. At this time, the second transmission gate T2 is closed to disconnect the VCO from the feedback path; while OPEN_LOOP N is at a high level, the counter is turned off and outputs a low level, so that the NMOS switch M1 is turned off and the first transmission gate T1 is turned on; a voltage signal of VDD/2 is provided by the first voltage dividing resistor R1 and the second voltage dividing resistor R2 (note: R1=R2), and is then transferred to the loop filter through the first transmission gate T1, and charged in alignment, so as to output a voltage signal, i.e., the control voltage Vc=VDD/2 of the voltage-controlled oscillator. At this time, automatic frequency calibration is performed, and the tuning curve of the VCO is selected, so that when Vc=VDD/2, the output frequency of the VCO is closest to the desired frequency. After the automatic frequency calibration is completed, the OPEN_LOOP jumps from a low level to a high level, so that the first transmission gate T1 is closed, the second transmission gate T2 is opened, and the feedback path is reconnected. At the same time, the counter starts to work, and the reference clock signal CLK_REF is input to the counter as its clock signal through the other port of the intermediate stage circuit. During this period, the counter outputs a high level to turn on the NMOS switch M1 and discharge the loop filter. The input voltage signal of the loop filter is 0, and then the output voltage signal of the loop filter, that is, the control voltage Vc of the voltage-controlled oscillator, is controlled to be 0, so that the output frequency of the VCO is lower than the expected frequency, and thus the feedback clock frequency is lower than the reference clock frequency. When the counter counts, the phase frequency detector continuously receives the reference clock signal and the feedback clock signal. In this way, even if the phase of the reference clock signal lags behind that of the feedback clock signal at the beginning, it can be adjusted back within this time to ensure that there will be no cycle slip when the LOOP_CUT releases Vc. After the counter finishes counting, the output signal PLUSE changes to a low level again, and the NMOS switch M1 is turned off. At this time, because the OPEN_LOOP is at high level, the first transmission gate T1 is closed, the second transmission gate T2 is opened, and the charge pump and the loop filter are directly connected through the second transmission gate T2. The charge pump charges and discharges the loop filter to change its output voltage, that is, the control voltage Vc of the voltage-controlled oscillator, and then adjusts its output frequency, and the loop really enters the normal locking stage. At the same time, since the output frequency of VCO is lower than the expected frequency, that is, the feedback clock frequency is lower than the reference clock frequency, there will be no abnormal locking state caused by the frequencies of two clock signals being too close, and the locking time will be greatly prolonged.

Figure 5:
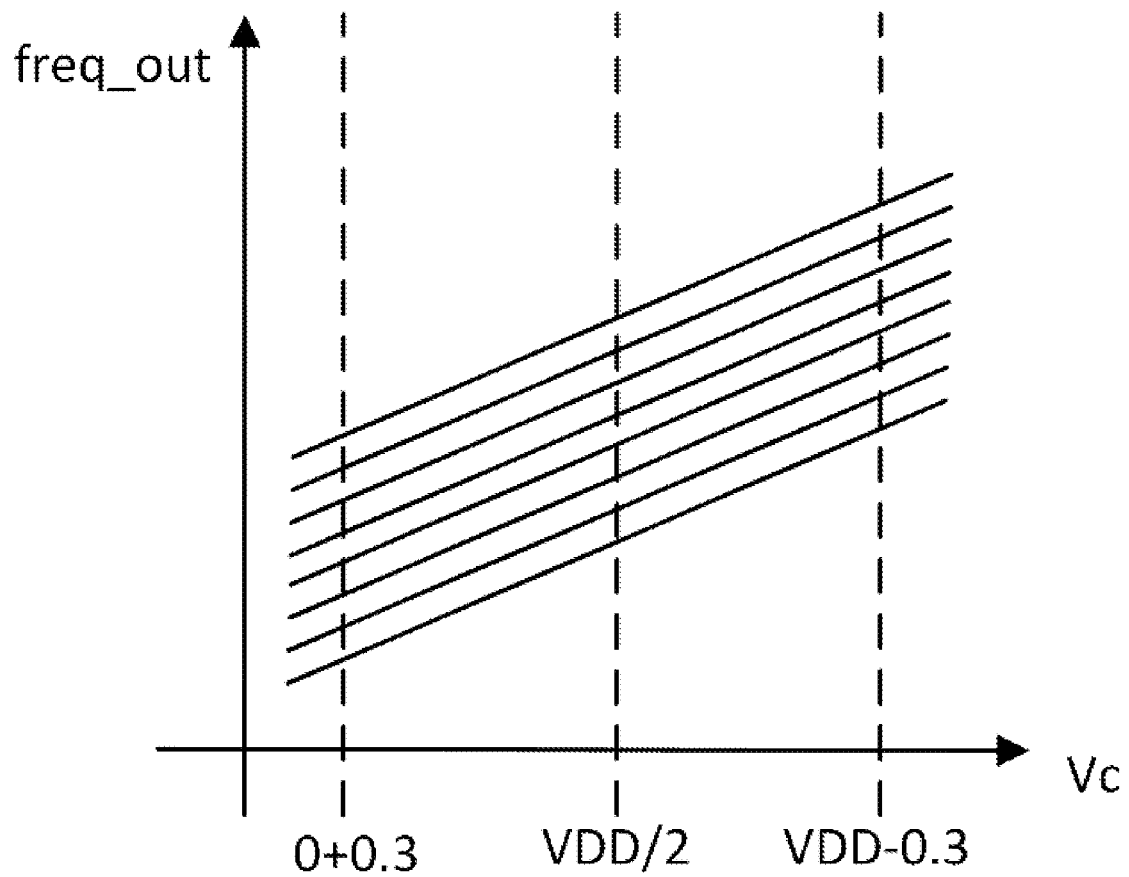
FIG. 5 is a schematic diagram of an improved phase-locked loop circuit for avoiding cycle slip according to the present application.

FIG. 5 is a partial tuning curve of the VCO. It is obvious that with the increase of control voltage Vc, the output frequency of the VCO also increases. Generally, during automatic frequency calibration, VDD/2 is often used as a fixed value of Vc, so when the loop is opened, Vc is pulled down to 0, so as to avoid the occurrence of abnormal locking state caused by the initial output frequency of the VCO being too close to the expected frequency.

Figure 6:
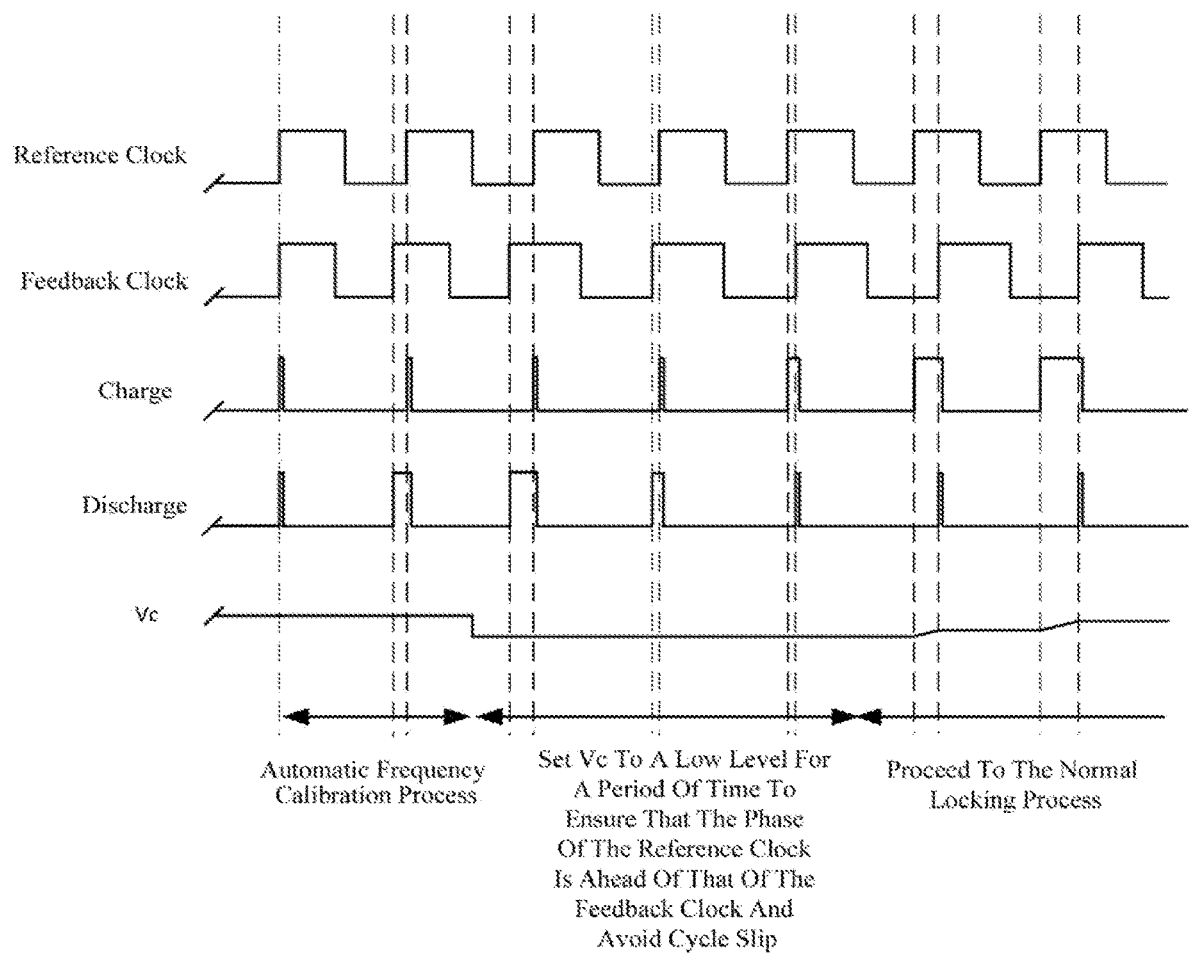
FIG. 6 is a schematic signal diagram of the improved phase-locked loop circuit for avoiding cycle slip according to the present application.

FIG. 6 is a schematic signal diagram of a fast lock phase-locked loop system for avoiding cycle slip according to the present application. In the initial period of time, it is the process of loop automatic frequency calibration, at which time Vc=VDD/2. Then Vc is pulled down to 0, so that the feedback clock frequency is lower than the reference clock frequency. At this time, if cycle slip occurs and the phase of the reference clock lags behind that of the feedback clock, after several reference clock cycles, the phase of the reference clock will surpass the feedback clock again, then Vc is released and the loop is locked normally, thereby avoiding occurrence of cycle slip when the loop is really started.

What is claimed is:

1. A fast lock phase-locked loop circuit for avoiding cycle slip, comprising a phase frequency detector, a charge pump, an intermediate stage circuit, a loop filter, a voltage-controlled oscillator and a frequency divider, wherein an output OP end of the phase frequency detector is connected with an input IP end of the charge pump, and an output ON end of the phase frequency detector is connected with an input IN end of the charge pump; an output end of the charge pump is connected with an input IN end of the intermediate stage circuit, an output end of the intermediate stage circuit is connected with an input end of the loop filter, an output end of the loop filter is connected with an input end of the voltage-controlled oscillator, an output end of the voltage-controlled oscillator is connected with an input end of the frequency divider, an output end of the frequency divider is connected with an input IN end of the phase frequency detector to form a feedback path;

the intermediate stage circuit comprises a power supply, a first voltage dividing resistor R1, a second voltage dividing resistor R2, an inverter, a first transmission gate T1, a second transmission gate T2, a counter, and an NMOS switch M1; wherein an end of the second transmission gate T2 is connected with the output end of the charge pump; one port of the intermediate stage circuit is connected with the inverter, the inverter is connected with one input end of the counter, an output end of the counter is connected with a gate G end of the NMOS switch M1, and a source S end of the NMOS switch M1 is grounded; the other port of the intermediate stage circuit is connected with the other input end of the counter; the power supply is connected with the first voltage dividing resistor R1, the first voltage dividing resistor R1 is connected in series with the second voltage dividing resistor R2, and the second voltage dividing resistor R2 is grounded; output ends of the first voltage dividing resistor R1 and the second voltage dividing resistor R2 are connected to one end of the first transmission gate T1; the other end of the first transmission gate T1, a drain D end of the NMOS switch M1 and the other end of the second transmission gate T2 are connected to the input end of the loop filter.

2. The fast lock phase-locked loop circuit for avoiding cycle slip according to claim 1, wherein an OPEN_LOOP control signal is input from one port of the intermediate stage circuit, and an OPEN_LOOP N signal is obtained after passing through the inverter; the OPEN_LOOP control signal and the OPEN_LOOP N signal jointly control switches of the first transmission gate T1 and the second transmission gate T2, and the counter; when the control signal OPEN_LOOP is at a high level, the first transmission gate T1 is closed and the second transmission gate T2 is opened, and the feedback path is in a normal locked state, the charge pump is directly connected with the loop filter through the second transmission gate T2, and the loop filter outputs a voltage signal Vc, which is a control voltage of the voltage-controlled oscillator; while when the control signal OPEN_LOOP is at a low level, the first transmission gate T1 is opened and the second transmission gate T2 is closed, in which case, the loop is in a state of automatic frequency calibration and cycle slip avoidance; the power supply transmits a voltage signal VDD to the first voltage dividing resistor R1 and the second voltage dividing resistor R2, the first voltage dividing resistor R1 and the second voltage dividing resistor R2 output a voltage signal of VDD/2, and meanwhile an output signal PLUSE of the counter is at a low level, that is, a gate G voltage of the NMOS switch M1 is at a low level and is in a turned-off state; the first voltage dividing resistor R1 and the second voltage dividing resistor R2 are connected to the loop filter through the first transmission gate T1, and the loop filter outputs a voltage signal Vc=VDD/2, which is the control voltage of the voltage-controlled oscillator; when the control signal OPEN_LOOP jumps from a low level to a high level, the counter starts to work, at the same time, a reference clock signal CLK_REF is input to the counter as a clock signal thereof through the other port of the intermediate stage circuit, in which case, when the counter counts, an output signal PLUSE of the counter is at a high level, and the NMOS switch M1 is turned on, in which case, the drain end D of the NMOS switch M1 is connected with the loop filter, and an input voltage signal LPF_IN of the loop filter is 0, that is, the control voltage Vc of the voltage-controlled oscillator is 0; when the counter finishes counting, an output signal PLUSE thereof changes back to a low level, and the NMOS switch M1 is turned off, in which case, the first transmission gate T1 is closed, and the second transmission gate T2 is opened; the charge pump is directly connected with the loop filter through the second transmission gate T2, and the loop filter outputs a voltage signal Vc, which is the control voltage of the voltage-controlled oscillator.

* * * * *